(12) United States Patent
Erstad

(10) Patent No.: US 7,804,354 B2
(45) Date of Patent: Sep. 28, 2010

(54) CIRCUIT ARCHITECTURE FOR RADIATION RESILIENCE

(75) Inventor: David O. Erstad, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/923,017

(22) Filed: Oct. 24, 2007

(65) Prior Publication Data

US 2009/0108912 A1    Apr. 30, 2009

(51) Int. Cl.
*G05F 1/10* (2006.01)
*G05F 3/02* (2006.01)

(52) U.S. Cl. .................. 327/539; 323/313; 323/314; 323/315; 323/316; 323/317

(58) Field of Classification Search ............... 327/539, 327/199–225; 323/313–317
See application file for complete search history.

(56) References Cited

U.S. PATENT DOCUMENTS

| | | | |
|---|---|---|---|
| 4,281,278 A | 7/1981 | Bilsky et al. | |
| 5,081,410 A | 1/1992 | Wood | |
| 5,148,099 A | 9/1992 | Ong ........................... | 323/314 |
| 5,796,274 A | 8/1998 | Willis et al. | |
| 6,060,874 A * | 5/2000 | Doorenbos .................. | 323/316 |
| 6,326,809 B1 | 12/2001 | Gambles et al. ............... | 326/46 |
| 6,656,803 B2 | 12/2003 | Chan ........................... | 438/284 |
| 6,777,753 B1 | 8/2004 | Summers et al. ............. | 257/351 |
| 6,794,908 B2 | 9/2004 | Erstad ........................ | 327/112 |
| 6,917,533 B2 | 7/2005 | Gardner et al. ................ | 365/94 |
| 6,950,317 B2 | 9/2005 | Lynch et al. .................. | 363/16 |
| 7,123,898 B2 | 10/2006 | Burgener et al. ............. | 455/333 |
| 7,132,877 B2 | 11/2006 | Summer ..................... | 327/427 |
| 7,212,056 B1 | 5/2007 | Belov ......................... | 327/210 |
| 2007/0252573 A1* | 11/2007 | Tachibana et al. ........... | 323/313 |

FOREIGN PATENT DOCUMENTS

EP    1328075    4/2009

OTHER PUBLICATIONS

"Radiation Hardening." Wikipedia, The Free Encyclopedia. Jun. 28, 2007. Mar. 6, 2009.<http://web.archive.org.web/20070628185017/http://en.wikipedia.org/wiki/Radiation_hardening>.

Hughes, H. L. et al, "Radiation Effects and Hardening of MOS Technology: Devices and Circuits." IEEE Transactions on Nuclear Science, IEEE Service Center, New York, NY, US, vol. 50, No. 3, Jun. 1, 2003. ISSN: 0018-9499.

(Continued)

*Primary Examiner*—Lincoln Donovan
*Assistant Examiner*—John W Poos
(74) *Attorney, Agent, or Firm*—Shumaker & Sieffert, P.A.

(57) ABSTRACT

A system and method for extending the operating life of a device susceptible to defects caused by total ionizing dose radiation and/or bias dependent degradation are described. The device is replicated at least once and at least one switching mechanism is used to cycle between the devices such that only one device is operating normally. While the first device is operating normally, the other devices are biased. The bias condition may slow, eliminate, or even reverse device shifts that occur due to total ionizing dose radiation or bias effects.

19 Claims, 4 Drawing Sheets

OTHER PUBLICATIONS

Cindro, V. et al, "Bias-dependent Radiation Damage in High-resistivity Silicon Diodes Irradiated with Heavy Charged Particles." Nuclear Instruments & Methods in Physics Research, Section—A: Accelerators, Spectrometers, Detectors and Associated Equipment, Elsevier, Amsterdam, NL, vol. 450, No. 2-3, Aug. 11, 2000. ISSN: 0168-9002.

International Search Report for EP 08166985 dated Mar. 6, 2009.

* cited by examiner

CIRCUIT ARCHITECTURE FOR RADIATION RESILIENCE

FIELD

The present invention relates generally to circuit architecture, and more particularly, relates to a circuit architecture for extending time before loss of function caused by total dose ionizing radiation and/or bias dependent degradation.

BACKGROUND

Radiation can have harmful effects on microelectronics. For years, practitioners have studied the various ways that different types of radiation affect microelectronics, and have attempted to devise ways of eliminating or at least mitigating the problems that these various types of radiation can create for microelectronics. Three major types of ionizing radiation-induced effects are soft errors (a.k.a. single event effects), dose-rate effects, and total dose effects. Other non-ionizing radiation effects are also well-documented.

Single event effects occur when a high energy particle (such as a cosmic ray, proton, or neutron) changes the state of a particular device in an integrated circuit, thereby causing a loss of information. Single event effects are typically localized to a particular region of an integrated circuit.

Dose rate effects are caused by the exposure of an entire integrated circuit to a flood of radiation, typically X-ray or Gamma-ray radiation. Dose rate effects are typically related to a short burst (ns to ms) of high intensity radiation, such as that emitted by a nuclear detonation. Such exposure can cause temporary, and in some cases permanent, failure in integrated circuits.

Total dose effects in devices are related to the permanent failure of an integrated circuit caused by an accumulation of radiation dose. Such failures typically result from the trapping of holes produced by ionizing radiation in an insulating $SiO_2$ region, such as in a gate oxide or field oxide region. As the name suggests, total dose effects are related to the entire exposure history of an integrated circuit and when the total dose exceeds some threshold value, circuit failure is observed. This cumulative nature of total dose effects distinguishes this type of radiation effect from single event effects and dose rate effects, which are related instead to short term, transient phenomena.

Total dose effects can cause shifts in device characteristics, such as shifts in threshold voltage, transconductance, saturation current, and so on. The threshold voltage of a Metal-Oxide Semiconductor Field-Effect Transistor (MOSFET) is usually defined as the gate voltage at which a depletion region forms in the substrate (body) of a transistor. In an n-type MOSFET (NMOS), the substrate of the transistor is composed of p-type silicon, which has more positively charged electron holes compared to electrons. When a voltage is applied to the gate, an electric field causes the electrons in the substrate to become concentrated at the region of the substrate nearest the gate causing the concentration of electrons to be equal to that of the electron holes, creating a depletion region.

If the gate voltage is below the threshold voltage, the transistor is turned off and ideally there is no current from the drain to the source of the transistor. If the gate voltage is larger than the threshold voltage, the transistor is turned on, due to there being more electrons than holes in the substrate near the gate, creating a channel where current can flow from drain to source. Shifts in the threshold voltage can detrimentally change the operating characteristics of the transistor.

Bias effects, such as negative bias temperature instability (NBTI), can also cause shifts in threshold voltage. NBTI occurs as a result of stressing a device with a large negative bias at elevated temperatures. The NBTI-induced threshold voltage shift typically occurs over a period of months or years, depending on the operating conditions of the device. NBTI is most problematic for high-performance or high-reliability devices, and analog/mixed-signal devices are more susceptible than digital devices.

Shifts in device characteristics caused by total ionizing dose radiation or bias effects are undesirable. Thus, it would be beneficial to have a circuit architecture that mitigates this problem.

SUMMARY

A system and method for extending the operating life of a device susceptible to defects caused by total ionizing dose radiation or bias dependent degradation is described. The system includes a first device, a second device substantially the same as the first device, and a switching mechanism that cycles between selecting one of the first device and second device to operate in a normal operating condition. In one example, the first device and the second device are diodes. In another example, the first and second devices are transistors.

The switching mechanism may include an input switching circuit and an output switching circuit. The input switching circuit may determine what inputs the first and second devices receive. The output switching circuit may determine which one of the first device or second device is selected to provide an output. The switching mechanism may cycle between the first device and the second device based on a system clock.

The one of the first and the second devices not selected to operate in the normal operating condition may receive an input selected to minimize radiation effects. For example, the input to the device not selected to operate in the normal operating condition may have a value greater than the value of the input to the device selected to operate in the normal operating condition. The input may be a current or voltage input.

In one example, the system for extending the operating life of a device susceptible to defects caused by total ionizing dose radiation or bias dependent degradation includes a first diode, a second diode, a first switching mechanism that that selects a first input current to provide to the first diode and a second switching mechanism that that selects a second input current to provide to the second diode. The first and second switching mechanisms may be analog multiplexers.

A method for extending the operating life of a device susceptible to defects caused by total ionizing dose radiation or bias dependent degradation is also described. The method includes providing a first device, providing a second device substantially the same as the first device, and switching between one of the first device and second device to operate in a normal operating condition.

The method may also include biasing the device which is not operating in a normal operating condition. Biasing the device may include providing a first input to the device not operating in the normal operating condition that is different than a second input provided to the device operating in the normal operating condition. The first and second inputs may be current or voltage inputs.

Switching between one of the first and second devices may include selecting inputs to the first and second devices. Switching between one of the first and second devices may also include selecting which one of the first and second devices provides an output. The selections of which inputs to provide to the first and second devices and which one of the devices provides an output may occur at different times. The switching between one of the first and second devices may occur by using a system clock to determine when to switch between the first and second devices.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
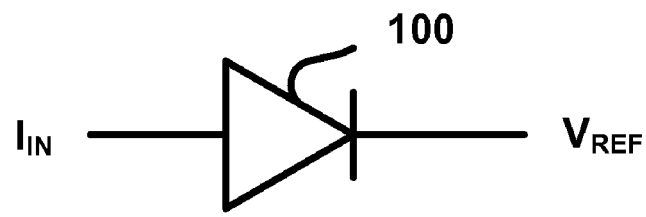
FIG. 1 is a block diagram of a diode, such as a diode used in a bandgap voltage reference circuit, according to an example.

FIG. 1 is a block diagram of a diode 100. The diode 100 may be used in a bandgap voltage reference circuit where a constant current is used to stimulate the diode 100 and the voltage across the diode 100 is sensed. A bandgap voltage reference circuit is used in many analog, digital, and mixed-signal integrated circuits. Circuits such as oscillators, Phase Locked Loops (PLLs), and Dynamic Random Access Memories (DRAM) depend on stable, precise voltage references. There are many different circuit designs for bandgap voltage reference circuits that could use the diode 100.

The diode 100 is one type of circuit that is susceptible to defects caused by total ionizing dose radiation and/or bias dependent degradation. Because the purpose of the bandgap voltage reference circuit using the diode 100 is to provide a consistent, precise reference voltage, any defect caused by total dose effects or bias effects may impact the operation of a system that includes the diode 100. Thus, it would be beneficial to reduce these effects on the operation of the diode 100.

Figure 2:
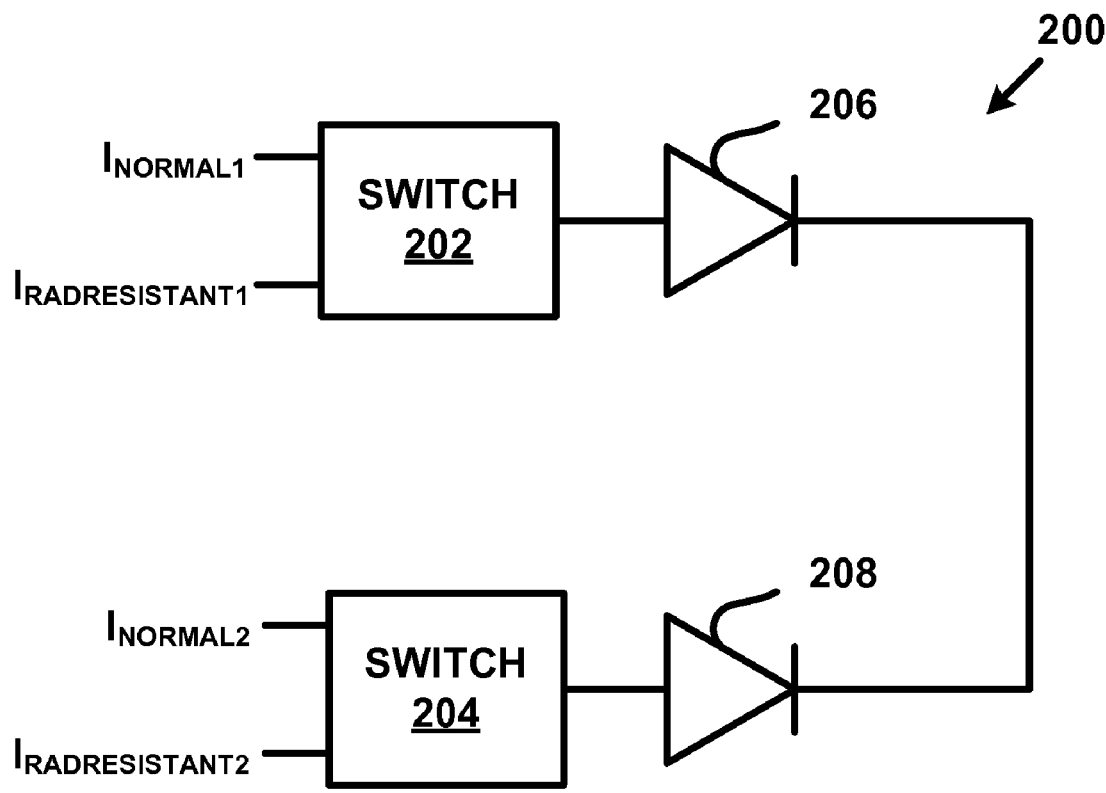
FIG. 2 is a block diagram of a radiation resilient system of diodes, according to an example.

FIG. 2 is a block diagram of a radiation resilient system of diodes 200. The radiation resilient system of diodes 200 includes two input switching mechanisms 202, 204, and two diodes 206, 208. Two input currents are available. $I_{NORMAL}$ is the input current associated with normal biasing of the diodes 206, 208 in, for example, a bandgap circuit. $I_{RADRESISTANT}$ is a current selected to minimize the effects of radiation on the diodes 206, 208. For example, $I_{RADRESISTANT}$ may be selected to be larger than $I_{NORMAL}$.

FIG. 2 depicts the two currents (NORMAL and RADRESISTANT) as inputs to the input switches 202, 204. The currents are designated as "1" for inputs to switch 202 and as "2" for switch 204. This designation is to indicate that the current inputs to the switches 202, 204 may come from the same or different current sources. If the different current sources are used, preferably, $I_{NORMAL1}$ is substantially the same as $I_{NORMAL2}$ and $I_{RADRESISTANT1}$ is substantially the same as $I_{RADRESISTANT2}$.

The first input switching mechanism 202 is used to determine which of the current inputs ($I_{NORMAL1}$, $I_{RADRESISTANT1}$) is provided as an input to the first diode 206. Similarly, second input switching mechanism 204 is used to determine which of the current inputs ($I_{NORMAL2}$, $I_{RADRESISTANT2}$) is provided as an input to the second diode 208. The switching mechanisms 202, 204 may be any type of switching mechanism now known or designed in the future for selecting and/or deselecting signals to be provided as an output. For example, the switching mechanisms 202, 204 may be an analog multiplexer.

In operation, the radiation resilient diode system 200 cycles between using the first diode 206 and the second diode 208. At a first time period, when the first diode 206 is enabled for normal operation (i.e., providing $I_{NORMAL1}$ as an input to the diode 206), the operation of the first diode 206 operates in the normal manner (i.e., the first diode 206 operates as shown in FIG. 1). Additionally, when the first diode 206 is selected, the second diode 208 is biased to reduce the effects of total ionizing dose radiation or bias dependent degradation.

During the first time period, the second diode 208 may be described as being in a "reduced radiation sensitivity mode." In general, the effects of total dose radiation on a semiconductor device are a function of voltage biases experienced by the device. For example, for a diode such as the diode 100, the radiation shifts may be the largest when the device has a small current through the device, and smallest when the device has a large current flowing through the device. In such a case, $I_{RADRESISTANT}$ is preferably larger than $I_{NORMAL}$. For example, $I_{RADRESISTANT}$ may be approximately ten times larger than $I_{NORMAL}$. When the second diode 208 is deselected, the switch 204 provides $I_{RADRESISTANT}$ to the diode 208, keeping the diode 208 in a state that minimizes radiation damage.

At a second time period, the switching mechanisms 202, 204 select the second diode 208 and deselect the first diode 206. During this period, the operation of the second diode 208 operates in the normal manner (i.e., the second diode 208 operates as shown in FIG. 1) and the first diode 206 is biased to reduce the effects of total ionizing dose radiation or bias dependent degradation. As described before, the first diode 206 may be considered as being in the "reduced radiation sensitivity mode" at this time.

Moreover, it is not necessary for the radiation resilient system of diodes 200 to cycle between using the first diode 206 and the second diode 208 at a specific frequency or rate. The cycle frequency may be regular or irregular. However, the cycle frequency for alternatively selecting the diodes 206, 208 may be conveniently based on a system clock.

Figure 3:
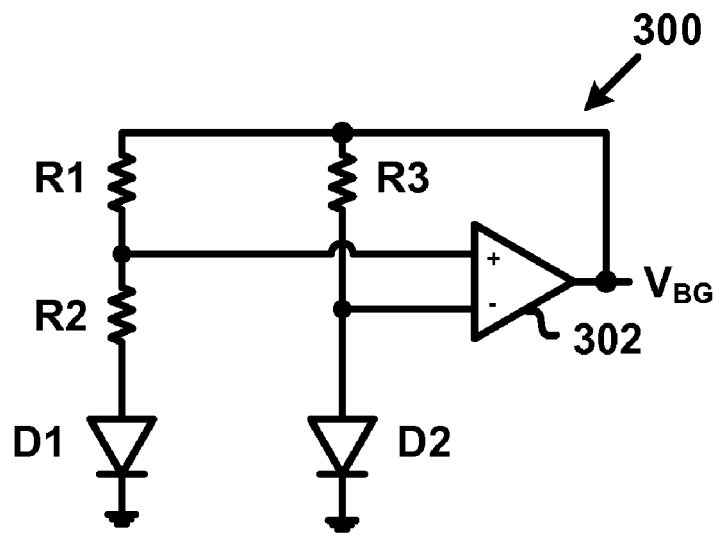
FIG. 3 is a circuit diagram of a bandgap reference circuit, according to an example.

FIG. 3 is a circuit diagram of a typical bandgap voltage reference circuit 300. In this example, the bandgap voltage reference circuit 300 includes two diodes D1, D2, three resistors R1, R2, R3, and an operational amplifier 302. An output of the circuit 300 is a bandgap voltage ($V_{BG}$) that may be used as a voltage reference in various applications.

The operation principle of the bandgap voltage reference circuit 300 is quite straightforward. The voltage difference between the two diodes D1 and D2, often operated at the same current and of different junction areas, is used to generate a proportional to absolute temperature (PTAT) current in the resistor R3. This current is used to generate a voltage in the resistor R2. This voltage in turn is added to the voltage of one of the diodes. The voltage across the diode is operated at constant current, or here with a PTAT current, is complementary to absolute temperature (CTAT, reduces with increasing temperature), with approximately −1.5 mV/K.

If the ratio between resistors R2 and R3 is chosen properly, the first order effects of the temperature dependency of the diode and the PTAT current cancels out. The resulting voltage is temperature independent, and is close to the theoretical bandgap of silicon at 0° K. The remaining voltage change over the operating temperature of typical integrated circuits is on the order of a few millivolts. This temperature dependency typically has a parabolic behavior.

Figure 4:
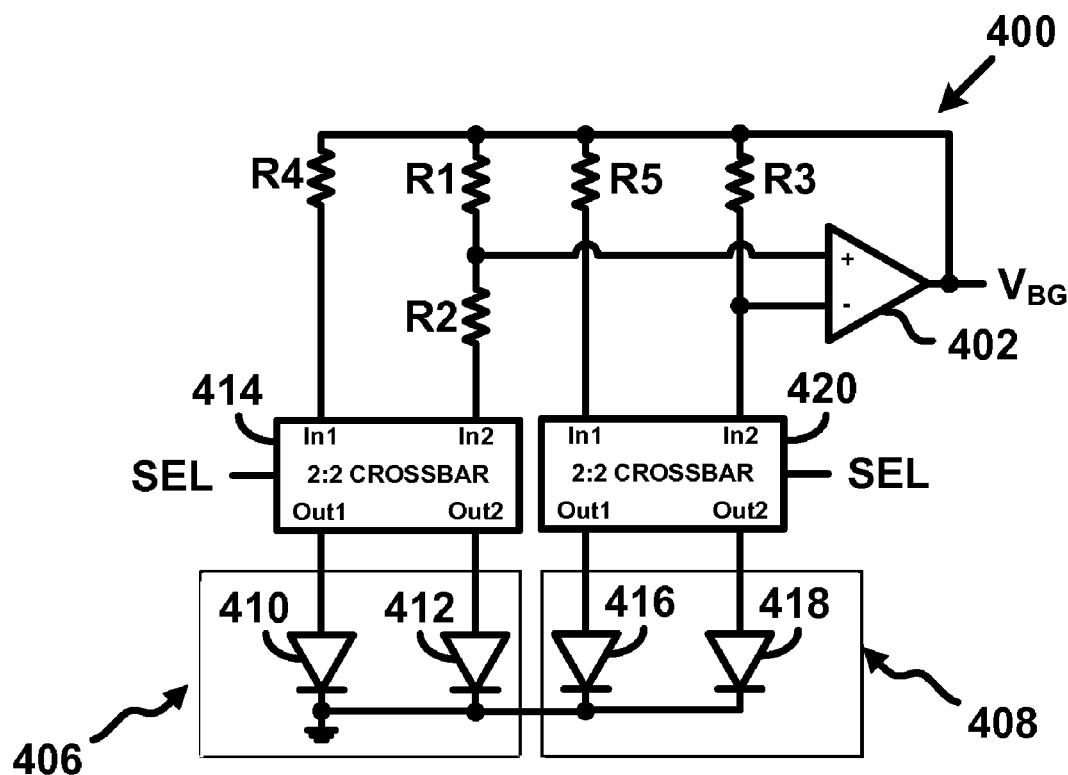
FIG. 4 is a circuit that may be used to fabricate a radiation resilient bandgap reference circuit, according to an example.

FIG. 4 shows a circuit diagram of a radiation resilient bandgap voltage reference circuit 400 according to an example. The diode D1 has been replaced with a network 406 containing of two diodes 410 and 412, and an analog crossbar switch 414. Similarly, the diode D2 has been replaced by network 408 containing diodes 416 and 418, and an analog crossbar switch 420.

The operation of the radiation resilient bandgap voltage reference circuit 400 is as follows. When the SEL signal is high, the analog crossbar switch 414 directs the bias current from R1/R2 through the diode 412, and the analog crossbar switch 420 directs the bias current from R3 through the diode 418. The bandgap voltage output, $V_{BG}$, is generated in the same fashion as in FIG. 3. However, the diodes 410 and 416 receive a different bias current.

For example, R4 may be sized to be about one-tenth the sum of the R1 and R2 resistances and, thus, the diode 410 receives approximately ten times the current that is flowing through the diode 412. Likewise, R5 may be sized to be about one-tenth the R3 resistance and, thus, the diode 416 may receive approximately ten times the current that is flowing through the diode 418. As a result of these different bias currents, these diodes may experience reduced radiation shifts. At some interval, which may be periodic or irregular, the state of the SEL signal is switched from high to low. This causes the radiation resilient bandgap voltage reference circuit 400 to operate normally using the diodes 410 and 416, while the diodes 412 and 418 experience the different bias current, which may reduce the radiation shifts.

Figure 5:
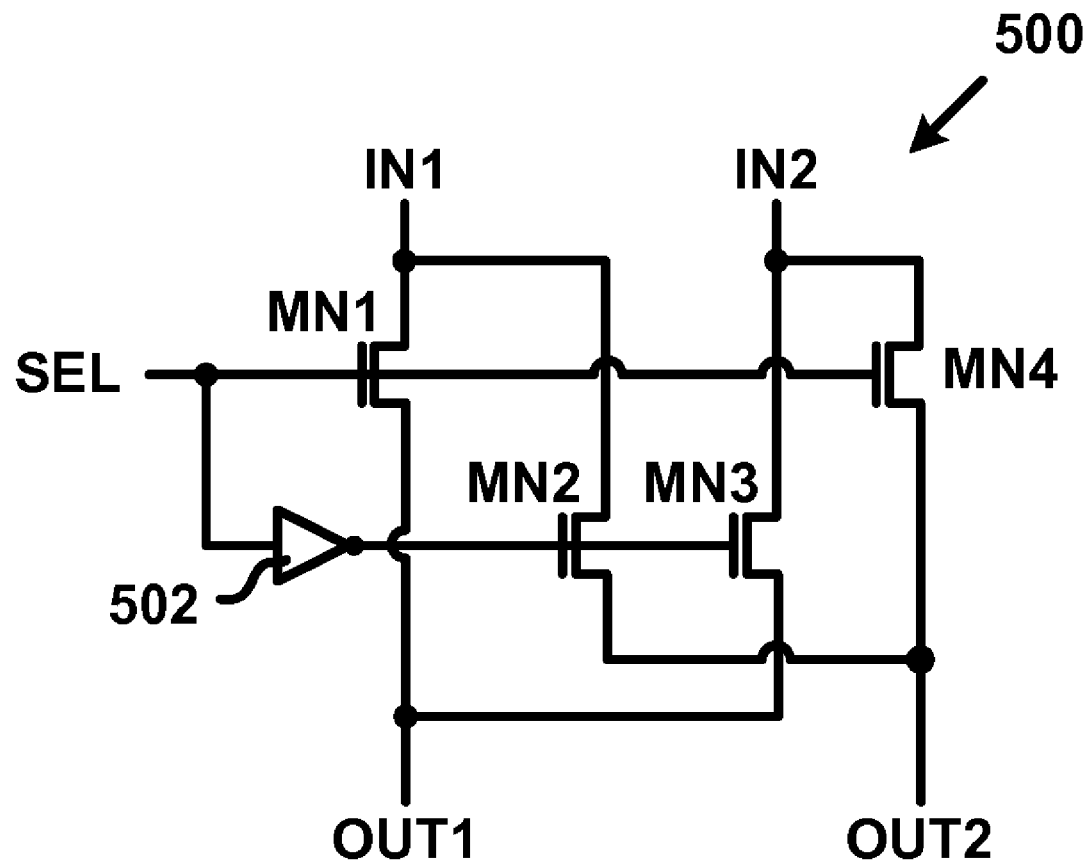
FIG. 5 is a circuit diagram of a 2:2 analog cross bar switch used in the circuit depicted in FIG. 4, according to an example.

FIG. 5 shows a circuit diagram of a 2:2 analog crossbar switch 500 that may be used in the radiation resilient bandgap voltage reference circuit 400 depicted in FIG. 4. Other switch designs may also be used. The switch 500 includes four transistors MN1, MN2, MN3, MN4 and an inverter 502. The transistors MN1, MN2, MN3, MN4 are not limited to any transistor type.

The operation of 2:2 analog crossbar switch 500 is as follows. When SEL is in a high state, the transistors MN1 and MN4 are on, while the transistors MN2 and MN3 are off. Accordingly, a current flowing into IN1 will be coupled to OUT1, and a current flowing into IN2 will be coupled to OUT2. When SEL is in a low state, the transistors MN1 and MN4 are off, while the transistors MN2 and MN3 are on. Thus, a current flowing into IN1 will be coupled to OUT2, and a current flowing into IN2 will be coupled to OUT1. It will be appreciated that other embodiments for analog crossbar switches are possible.

Additional embodiments of such a bandgap circuit will be apparent to those skilled in the art. For example, the embodiment shown uses the analog crossbars both to select the currents to be applied to the individual diodes, and to select which diode voltage is presented to the amplifier. The voltage seen by the amplifier will include any voltage dropped across the switch. An alternate approach would be to use a separate multiplexor to select which diode voltage is presented to the amplifier. Further, should there be a separate output multiplexor, the switching mechanisms may allow the current input to the diode(s) receiving the radiation resistance biasing to be changed to the current appropriate for normal operation some period of time before the output is switched to that diode, allowing time for the diode voltage to stabilize. Many such refinements are possible.

While the invention has been described with a diode, such as that used by a bandgap voltage reference circuit, it is understood that other devices may be benefited in the same manner. For example, as depicted in FIGS. 6-7, a transistor may also be benefited in this manner.

Figure 6:
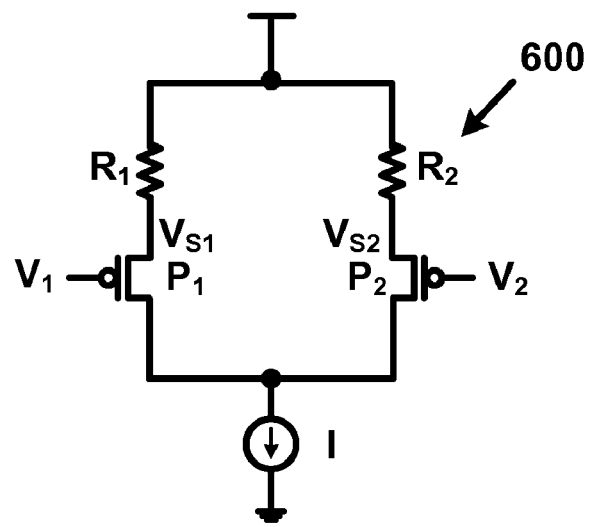
FIG. 6 is a circuit diagram of a differential amplifier, according to an example.

FIG. 6 is a circuit diagram of a typical differential amplifier 600. The operation of the differential amplifier 600 is as follows. The current source I guarantees that the sum of the currents through transistors P1 and P2 is a constant. When the gate of P1 is at a lower voltage than the gate of P2, more current flows through R1 and P1 causing VS1 to be lower than VS2, and vice versa. A key performance parameter for the differential amplifier 600 is the input offset voltage, which is primarily determined by the different in threshold voltages between P1 and P2. Design techniques exist to minimize the mismatch between these threshold voltages.

However, even if P1 and P2 are initially matched, during the life of the differential amplifier 600, P1 and P2 may become mismatched. For example, the differential amplifier 600 may be exposed to ionizing radiation. If the gates of P1 and P2 are held at different voltages during this ionizing radiation, they may experience differential threshold shifts. Similarly, if the gates are at different voltages over an extended period of time, they may be subject to differential device degradation due to Negative Bias Temperature Instability (NBTI).

Figure 7:
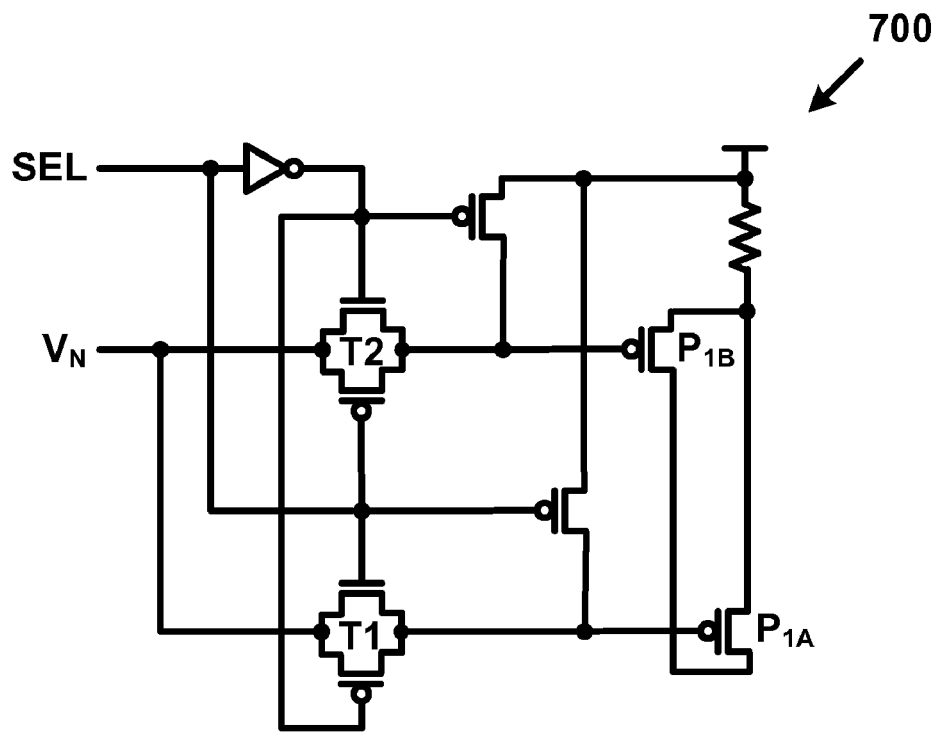
FIG. 7 is a circuit diagram of a circuit that may be used to fabricate a radiation resilient differential amplifier, according to an example.

To overcome these problems described with respect to the differential amplifier 600, the circuit 700 depicted in FIG. 7 may be used. A first copy of the circuit 700 replaces P1 and R1 depicted in FIG. 6, and a second copy of the circuit 700 is used to replace P2 and R2 depicted in FIG. 6.

As with the diode example, the select signal (SEL) is periodically switched between a logic-1 and a logic-0. When the select signal is at a logic-1, VN (i.e., V1 or V2 depicted in FIG. 6) is coupled to P1A through pass gate T1, while the gate of P1B is driven to the supply rail. Likewise, when the select signal is a logic-0, VN is coupled to P1B through pass gate T2, and the gate of P1A is driven to the supply rail.

During the times that P1A and P1B have their gates driven to the supply rail, they may experience a reduced threshold shift due to radiation or NBTI effects, and may even experience an annealing of such effects. Moreover, it will be appreciated that if, for example, P1A has its gate connected to the voltage supply, that there will be an analogous gate on the other side of the differential amplifier that is experiencing a similar bias and, to the extent that any radiation or NBTI shift occurs, will shift in a common mode fashion with P1A.

While a differential amplifier was used to explain the transistor benefits, it understood that other transistor circuit designs may also be benefited by replicating the device and cycling between devices.

The provided diode and transistor examples show that by replicating the device and cycling between devices, each device will operate less, reducing the accumulation of holes in the oxide and delaying when a device becomes inoperable due to shifts in device characteristics. Additionally, more than one replication of a device may be performed, cycling the operation between a plurality of devices. Moreover, when a device is not selected or activated, the device may be biased. The bias condition may slow, eliminate, or even reverse device shifts that occur due to total ionizing dose radiation or bias effects. As a result, the system including the device may have a longer expected operational lifetime.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A system for extending the operating life of a device susceptible to defects caused by total ionizing dose radiation or bias dependent degradation, comprising in combination:
    a first device;
    a second device substantially the same as the first device; and
    a switching mechanism that cycles between selecting one of the first device and the second device to operate in a normal operating condition, wherein the one of the first or the second device not selected to operate in the normal operating condition is operated to minimize radiation effects.

2. The system of claim 1, wherein the first device and the second device are diodes.

3. The system of claim 1, wherein the first device and the second device are transistors.

4. The system of claim 1, wherein the switching mechanism includes an input switching circuit and an output switching circuit.

5. The system of claim 4, wherein the input switching circuit determines what inputs the first and second devices receive.

6. The system of claim 4, wherein the output switching circuit determines which one of the first device and second device is selected to provide an output.

7. The system of claim 1, wherein the switching mechanism cycles between the first device and the second device based on a system clock.

8. The system of claim 1, wherein the input to the device not selected to operate in the normal operating condition has a value different than the value of the input to the device selected to operate in the normal operating condition.

9. A system for extending the operating life of a device susceptible to defects caused by total ionizing dose radiation or bias dependent degradation, comprising in combination:
    a first diode;
    a second diode substantially similar to the first diode;
    a first switching mechanism that selects a first input current to provide to the first diode wherein the first input current is configured to cause the first diode to operate in a first operating mode;
    a second switching mechanism that selects a second input current to provide to the second diode, wherein the second input current has a magnitude greater than the first input current to cause the second diode to operate in an operating mode that is less susceptible to radiation than the first operating mode.

10. The system of claim 9, wherein the first or second switching mechanisms are analog multiplexers.

11. A system for extending the operating life of a device susceptible to defects caused by total ionizing dose radiation or bias dependent degradation, comprising in combination:
    a first transistor;
    a second transistor substantially similar to the first transistor;
    a first switching mechanism that selects a first input voltage to provide to the first transistor, wherein the first input voltage is configured to cause the first transistor to operate in a first operating mode;
    a second switching mechanism that selects a second input voltage to provide to the second transistor, wherein the second input voltage has a magnitude greater than the first input voltage to cause the second transistor to operate in an operating mode that is less susceptible to radiation than the first operating mode.

12. The system of claim 11, wherein the first or second switching mechanisms are analog multiplexers.

13. A method for extending the operating life of a device susceptible to defects caused by total ionizing dose radiation or bias dependent degradation, comprising:
    switching between one of a first device and a second device to operate in a normal operating condition, wherein the second device is substantially the same as the first device; and
    connecting an input to the one of the first or the second device not selected to operate in the normal operating condition, the connected input causing the one of the first or the second device not selected to operate in the normal operating condition to operate in a second operating condition that is less susceptible to radiation than the normal operating condition.

14. The method of claim 13, further comprising biasing the device not operating in the normal operating condition.

15. The method of claim 14, wherein biasing the device includes providing a first input to the device not operating in the normal operating condition that is different than a second input provided to the device operating in the normal operating condition.

16. The method of claim 13, wherein switching between one of the first and second devices includes selecting inputs to the first and second devices.

17. The method of claim 13, wherein switching between one of the first and second devices includes selecting which one of the first and second devices provides an output.

18. The method of claim 13, wherein switching between one of the first and second devices includes selecting inputs to the first and second devices and selecting which one of the first and second devices provides an output, wherein the selections occur at different times.

19. The method of claim 13, wherein switching between one of the first and second devices includes using a system clock to determine when to switch between the first and second devices.

* * * * *